US009107316B2

(12) United States Patent
Cok

(10) Patent No.: US 9,107,316 B2
(45) Date of Patent: Aug. 11, 2015

(54) MULTI-LAYER MICRO-WIRE SUBSTRATE STRUCTURE

(71) Applicant: Ronald Steven Cok, Rochester, NY (US)

(72) Inventor: Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 73 days.

(21) Appl. No.: 14/023,740

(22) Filed: Sep. 11, 2013

(65) Prior Publication Data

US 2015/0068789 A1    Mar. 12, 2015

(51) Int. Cl.
| H05K 1/00 | (2006.01) |
| H05K 1/11 | (2006.01) |
| G06F 3/044 | (2006.01) |
| H05K 1/09 | (2006.01) |
| H05K 3/12 | (2006.01) |
| H05K 3/46 | (2006.01) |

(52) U.S. Cl.
CPC ............... *H05K 1/117* (2013.01); *G06F 3/044* (2013.01); *H05K 1/092* (2013.01); *H05K 3/1258* (2013.01); *H05K 3/4611* (2013.01); *H05K 2201/0919* (2013.01); *H05K 2201/09472* (2013.01); *H05K 2201/09709* (2013.01); *H05K 2201/09845* (2013.01)

(58) Field of Classification Search
USPC ........ 174/253, 261, 262; 349/43, 59, 60, 149, 349/150, 151, 153; 257/13, 49, 59, 99; 313/581; 345/76; 438/30, 42, 158
See application file for complete search history.

(56) References Cited

U.S. PATENT DOCUMENTS

| 5,311,341 | A | * | 5/1994 | Hirai ............................. 349/150 |
| 5,343,366 | A | * | 8/1994 | Cipolla et al. ................ 361/785 |
| 5,650,358 | A | * | 7/1997 | Gu et al. .......................... 438/30 |
| 5,723,945 | A | * | 3/1998 | Schermerhorn .............. 313/581 |
| 5,953,094 | A | * | 9/1999 | Matsuoka et al. ............ 349/153 |
| 6,033,927 | A | * | 3/2000 | Shibata et al. .................. 438/33 |
| 6,337,223 | B1 | * | 1/2002 | Kim et al. ........................ 438/42 |
| 7,180,927 | B2 | * | 2/2007 | Kwak et al. .................. 372/50.1 |
| RE43,124 | E | * | 1/2012 | Nakaminami et al. ........ 349/149 |
| 8,179,381 | B2 |   | 5/2012 | Frey et al. |
| 8,906,726 | B2 | * | 12/2014 | Wei et al. ........................ 438/42 |
| 2002/0135727 | A1 | * | 9/2002 | Nakaminami et al. ........ 349/149 |
| 2002/0186330 | A1 | * | 12/2002 | Kawasaki ........................ 349/43 |
| 2004/0008167 | A1 | * | 1/2004 | Shigeno .......................... 345/76 |
| 2005/0212986 | A1 | * | 9/2005 | Kawasaki ........................ 349/43 |

(Continued)

FOREIGN PATENT DOCUMENTS

CN    102063951    5/2011

*Primary Examiner* — Xiaoliang Chen
(74) *Attorney, Agent, or Firm* — Raymond L. Owens

(57) ABSTRACT

A multi-layer micro-wire structure includes a substrate having a substrate edge. A first layer is formed over the substrate extending to a first layer edge. One or more first micro-channels are imprinted in the first layer, at least one imprinted first micro-channel having a micro-wire forming at least a portion of an exposed first connection pad in the first layer. A second layer is formed over the first layer extending to a second layer edge. One or more second micro-channels are imprinted in the second layer, at least one imprinted second micro-channel having a micro-wire forming at least a portion of an exposed second connection pad in the second layer. The second-layer edge is farther from the substrate edge than the first-layer edge for at least a portion of the second-layer edge so that the first connection pads are exposed through the second layer.

20 Claims, 18 Drawing Sheets

(56) References Cited

U.S. PATENT DOCUMENTS

| | | | |
|---|---|---|---|
| 2006/0118795 A1* | 6/2006 | Araki | 257/83 |
| 2007/0096135 A1* | 5/2007 | Matsumoto | 257/99 |
| 2007/0242207 A1* | 10/2007 | Fujita | 349/149 |
| 2009/0121228 A1* | 5/2009 | Kim et al. | 257/59 |
| 2010/0026664 A1 | 2/2010 | Geaghan | |
| 2010/0045919 A1* | 2/2010 | Chida et al. | 349/149 |
| 2010/0328248 A1 | 12/2010 | Mozdzyn | |
| 2011/0003442 A1* | 1/2011 | Wang et al. | 438/158 |
| 2011/0007011 A1 | 1/2011 | Mozdzyn | |
| 2011/0024740 A1* | 2/2011 | Yamazaki et al. | 257/43 |
| 2011/0031496 A1* | 2/2011 | Yamazaki et al. | 257/59 |
| 2011/0062432 A1* | 3/2011 | Yamazaki et al. | 257/43 |
| 2011/0099805 A1 | 5/2011 | Lee | |
| 2011/0116003 A1* | 5/2011 | Inui | 349/60 |
| 2011/0148990 A1* | 6/2011 | Miyazawa et al. | 347/68 |
| 2011/0148991 A1* | 6/2011 | Miyazawa et al. | 347/68 |
| 2011/0157536 A1* | 6/2011 | Inui | 349/151 |
| 2011/0289771 A1 | 12/2011 | Kuriki | |
| 2011/0291966 A1 | 12/2011 | Takao et al. | |
| 2012/0146022 A1* | 6/2012 | Hida et al. | 257/49 |
| 2012/0181074 A1* | 7/2012 | Ishihara et al. | 174/261 |
| 2012/0241805 A1* | 9/2012 | Shibata et al. | 257/99 |
| 2012/0273755 A1* | 11/2012 | Wei et al. | 257/13 |
| 2013/0020120 A1* | 1/2013 | Ishihara et al. | 174/262 |
| 2014/0077214 A1* | 3/2014 | Deng | 257/59 |

* cited by examiner

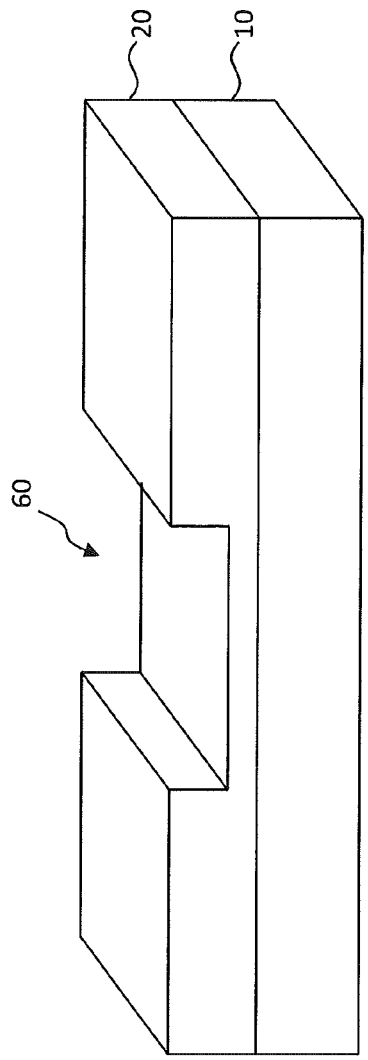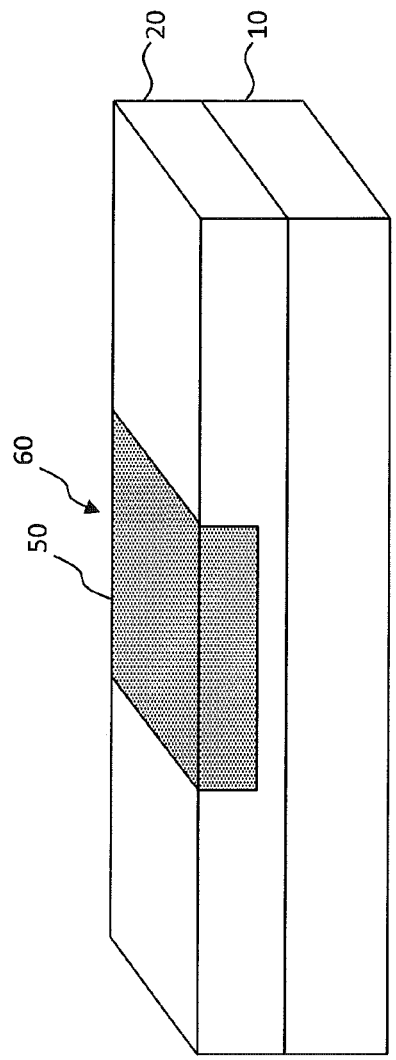
FIG. 4A
FIG. 4B

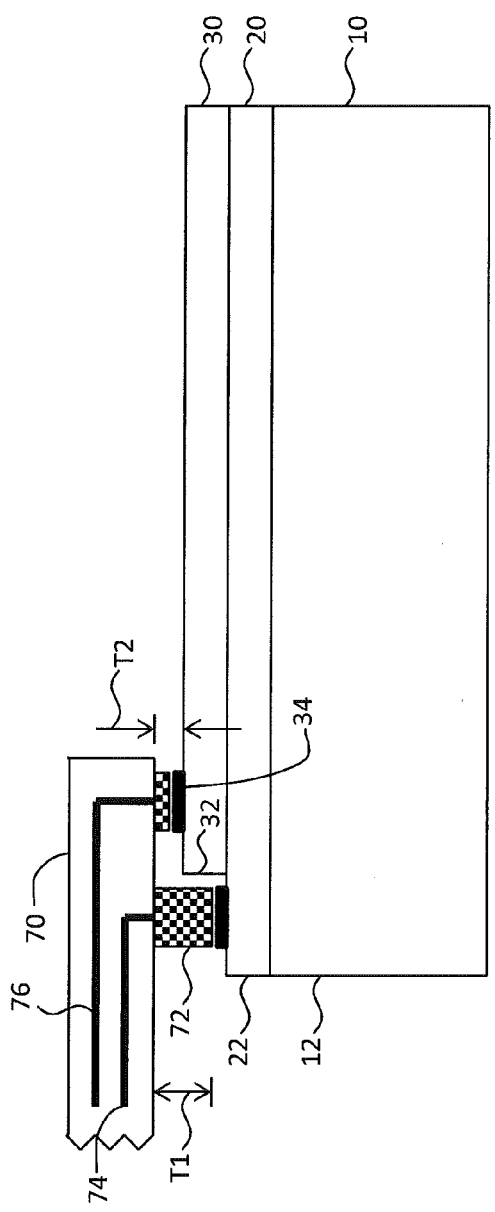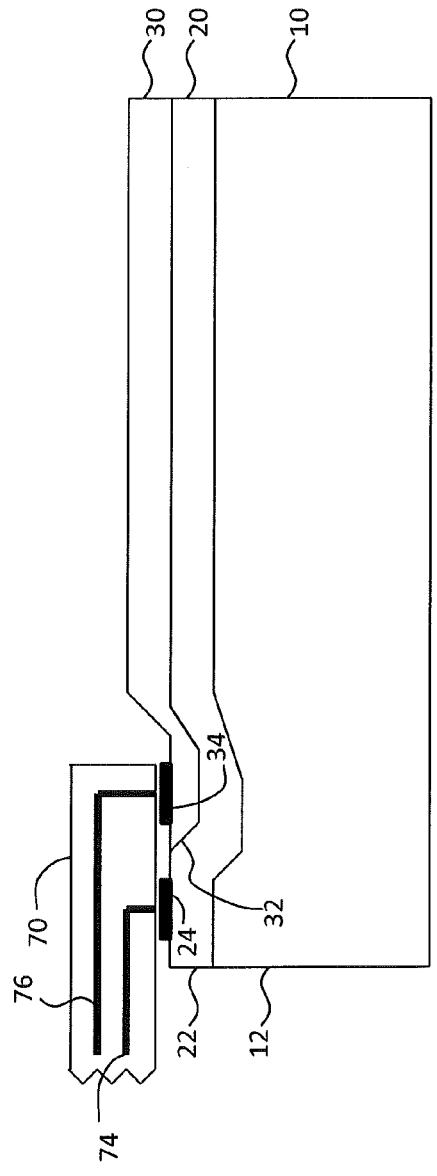
FIG. 12C
FIG. 12D

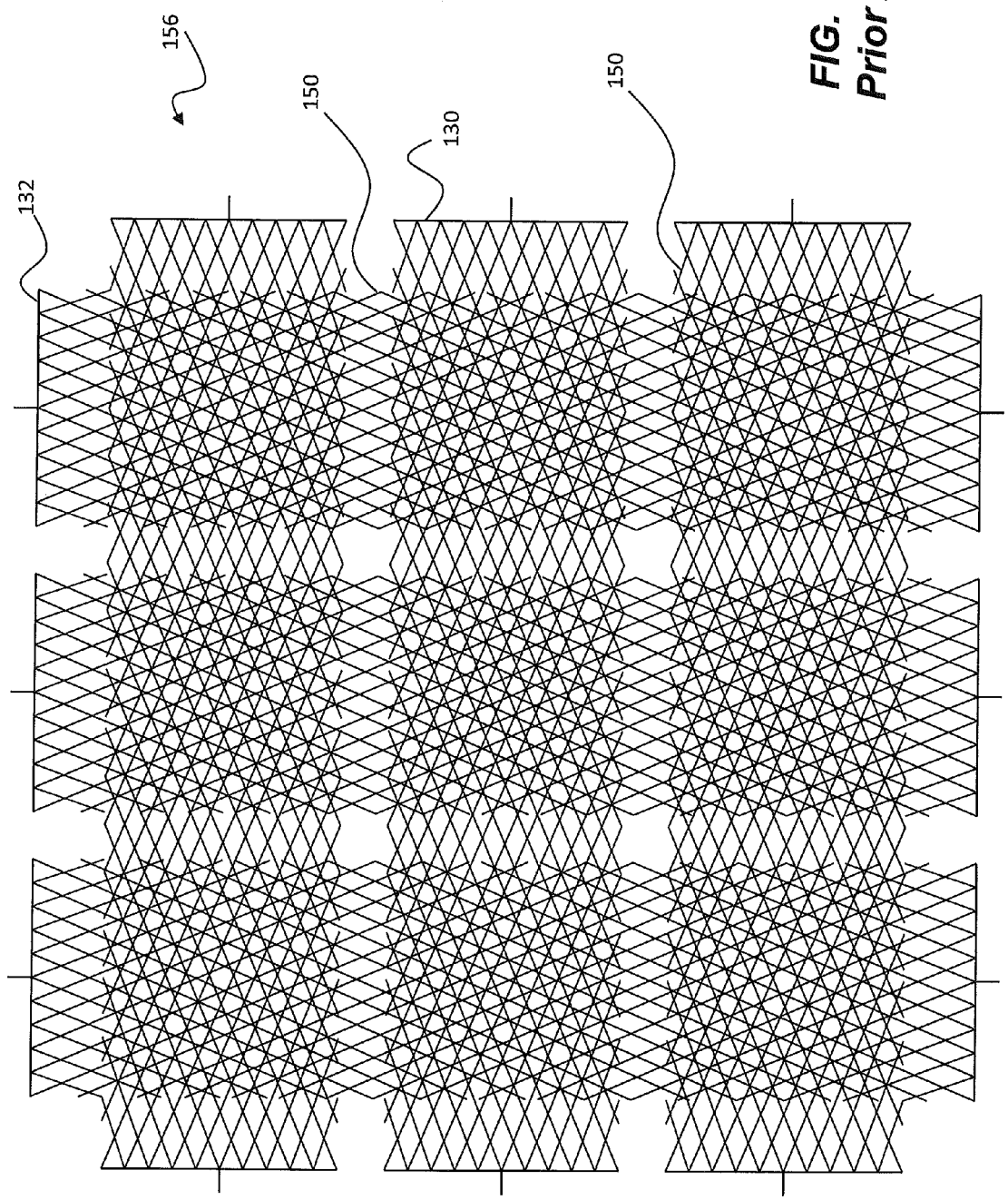

MULTI-LAYER MICRO-WIRE SUBSTRATE STRUCTURE

CROSS REFERENCE TO RELATED APPLICATIONS

Reference is made to commonly-assigned, co-pending U.S. patent application Ser. No. 14,023,757 filed Sep. 11, 2013, entitled "Multi-Layer Micro-Wire Substrate Method" by Ronald S. Cok, the disclosure of which is incorporated herein.

FIELD OF THE INVENTION

The present invention relates to substrates having imprinted micro-wires formed in multiple layers.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass.

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that is supplied to the pixel elements. Although thicker layers of metal oxides or metals increase conductivity, they also reduce the transparency of the electrodes.

Transparent electrodes, including very fine patterns of conductive elements, such as metal wires or conductive traces are known. For example, U.S. Patent Publication No. 2011/0007011 teaches a capacitive touch screen with a mesh electrode, as do U.S. Patent Publication No. 2010/0026664, U.S. Patent Publication No. 2010/0328248, and U.S. Patent No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between 0.5 μ and 4 μ wide and a transparency of between approximately 86% and 96%.

Conductive micro-wires are formed in micro-channels embossed in a substrate, for example as taught in CN102063951, which is hereby incorporated by reference in its entirety. As discussed in CN102063951, a pattern of micro-channels are formed in a substrate using an embossing technique. Embossing methods are generally known in the prior art and typically include coating a curable liquid, such as a polymer, onto a rigid substrate. A pattern of micro-channels is embossed (impressed or imprinted) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

Referring to FIG. 16, a prior-art display and touch-screen system 100 includes a display 110 with a corresponding touch screen 120 mounted with the display 110 so that information displayed on the display 110 is viewed through the touch screen 120. Graphic elements displayed on the display 110 are selected, indicated, or manipulated by touching a corresponding location on the touch screen 120. The touch screen 120 includes a first transparent substrate 122 with first transparent electrodes 130 formed in the x-dimension on the first transparent substrate 122 and a second transparent substrate 126 with second transparent electrodes 132 formed in the y-dimension facing the x-dimension first transparent electrodes 130 on the second transparent substrate 126. A dielectric layer 124 is located between the first and second transparent substrates 122, 126 and first and second transparent electrodes 130, 132. The first and second transparent substrates 122, 126, and dielectric layer 124 are formed separately and laminated together.

The first and second transparent electrodes 130, 132 have a variable width and extend in orthogonal directions (for example as shown in U.S. Patent Application Publication Nos. 2011/0289771 and 2011/0099805). When a voltage is applied across the first and second transparent electrodes 130, 132, electric fields are formed between the first pad areas 128 of the x-dimension first transparent electrodes 130 and the second pad areas 129 of the y-dimension second transparent electrodes 132.

A display controller 142 connected through electrical buss connections 136 controls the display 110 in cooperation with a touch-screen controller 140. The touch-screen controller 140 is connected to the first and second transparent electrodes 130, 132 through electrical buss connections 136 and wires 134 and controls the touch screen 120. The touch-screen controller 140 detects touches on the touch screen 120 by sequentially electrically energizing and testing the x-dimension first and y-dimension second transparent electrodes 130, 132.

U.S. Patent Application Publication No. 2011/0291966 discloses an array of diamond-shaped micro-wire structures. In this disclosure, a first electrode includes a plurality of first conductor lines inclined at a predetermined angle in clockwise and counterclockwise directions with respect to a first direction and provided at a predetermined interval to form a grid-shaped pattern. A second electrode includes a plurality of second conductor lines, inclined at the predetermined angle in clockwise and counterclockwise directions with respect to a second direction, the second direction perpendicular to the first direction and provided at the predetermined interval to form a grid-shaped pattern. This arrangement is used to inhibit Moiré patterns. The electrodes are used in a touch screen device. Referring to FIG. 17, this prior-art design includes micro-wires 150 arranged in a micro-pattern 156 with the micro-wires 150 oriented at an angle to the direction of horizontal first transparent electrodes 130 and vertical second transparent electrodes 132. The horizontal first transparent electrodes 130 are formed on an opposite side of a transparent substrate from the vertical second transparent electrodes 132.

The structure of FIG. 16 has first and second transparent substrates 122, 126 and a dielectric layer 124. In some applications, it is useful to form both horizontal and vertical first and second transparent electrodes 130, 132 on the same side of a single transparent substrate to reduce the thickness of the structure.

In such an application however, if the first and second transparent electrodes 130, 132 include impressed micro-wires formed in a layer coated over the single transparent substrate, it is difficult to electrically connect the micro-wires 150 (FIG. 17) to wires 134 (FIG. 16) external to the single transparent substrate.

SUMMARY OF THE INVENTION

There is a need, therefore, for alternative substrate and multi-layer micro-wire structures that provide reduced thickness and electrical connections for transparent electrodes having micro-wires in an imprinted micro-wire micro-pattern.

In accordance with the present invention, a multi-layer micro-wire structure, comprises:

a substrate having a substrate edge;

a first layer formed over the substrate extending to a first layer edge;

one or more first micro-channels imprinted in the first layer, at least one imprinted first micro-channel having a micro-wire forming at least a portion of an exposed first connection pad in the first layer;

a second layer formed over the first layer extending to a second layer edge;

one or more second micro-channels imprinted in the second layer, at least one imprinted second micro-channel having a micro-wire forming at least a portion of an exposed second connection pad in the second layer;

wherein the second-layer edge is farther from the substrate edge than the first-layer edge for at least a portion of the second-layer edge so that the first connection pads are exposed through the second layer.

The present invention provides a multi-layer micro-wire structure with reduced thickness and improved electrical connectivity.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 4A is a perspective of a micro-channel formed in a layer on a substrate useful in embodiments of the present invention;

FIG. 4B is a perspective of a micro-wire in a micro-channel formed in a layer on a substrate useful in embodiments of the present invention;

FIGS. 12A-12D are cross sections of embodiments of the present invention having a connector;

FIG. 17 is a plan view of micro-wire electrodes according to the prior art.

The Figures are not drawn to scale since the variation in size of various elements in the Figures is too great to permit depiction to scale.

DETAILED DESCRIPTION OF THE INVENTION

The present invention is directed toward multiple layers of electrically conductive micro-wires formed in micro-channels over a substrate. The layer structures facilitate electrical connections between the micro-wires and electronic components external to the substrate on which the multi-layer micro-wire structures are formed, providing improved connectivity and manufacturability.

Figure 1:
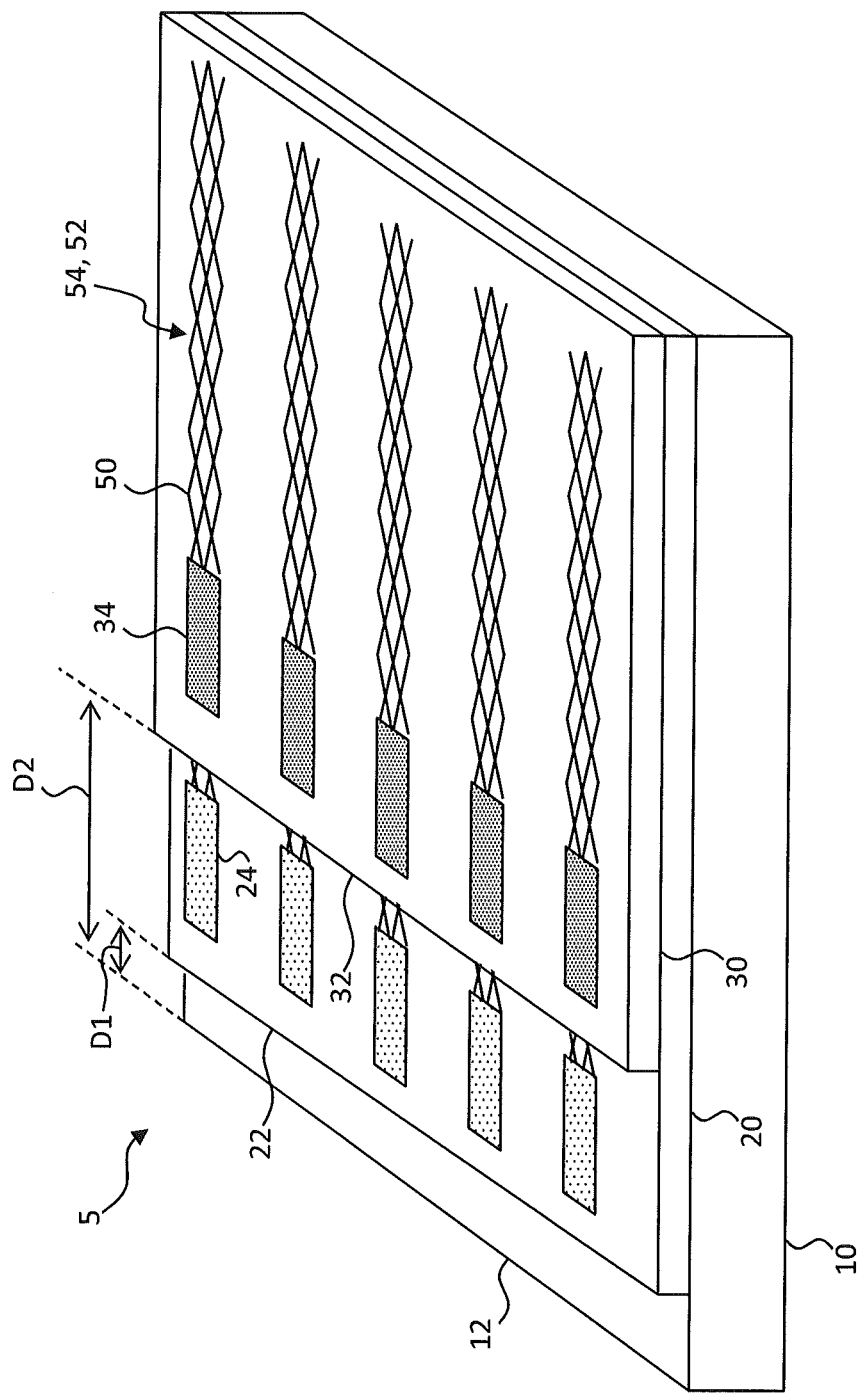
FIG. 1 is a perspective of a multi-layer micro-wire structure according to an embodiment of the present invention.
Figure 2:
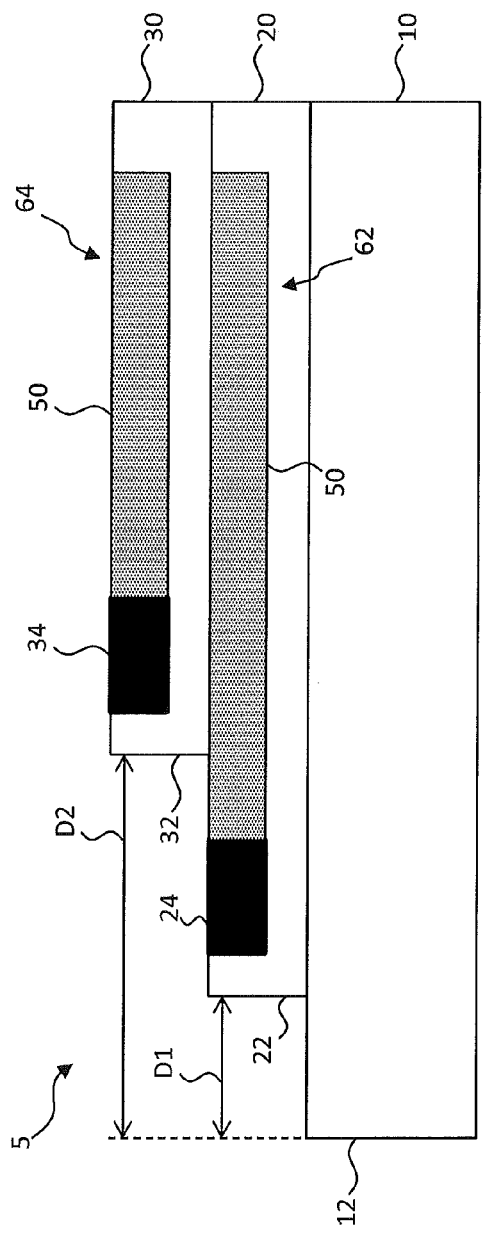
FIG. 2 is a cross section of a multi-layer micro-wire structure according to an embodiment of the present invention corresponding to FIG. 1.

Referring to the perspective of FIG. 1 and cross section of FIG. 2 in an embodiment of the present invention, a multi-layer micro-wire structure 5 includes a substrate 10 having a substrate edge 12. A first layer 20 is formed over the substrate 10 and extends to a first layer edge 22. A second layer 30 is formed over the first layer 20 and extends to a second-layer edge 32. As shown in FIG. 2, one or more first micro-channels 62 are imprinted in the first layer 20. At least one imprinted first micro-channel 62 has a micro-wire 50 forming at least a portion of an exposed first connection pad 24 in the first layer 20. At least one second micro-channel 64 is imprinted in the second layer 30. At least one imprinted second micro-channel 64 has a micro-wire 50 forming at least a portion of an exposed second connection pad 34 in the second layer 30. The first-layer edge 22 is a distance D1 from the substrate edge 12. The second-layer edge 32 is a distance D2 from the substrate edge 12. D2 is greater than D1 for at least a portion of the second-layer edge 32 so that the first connection pads 24 are exposed through the second layer 30.

Figure 3:
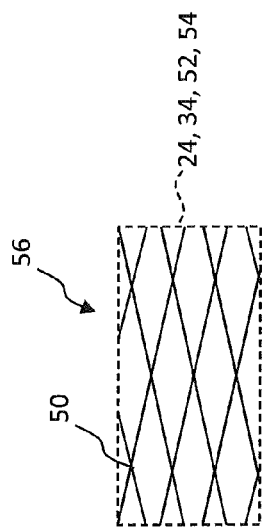
FIG. 3 is a plan view of a micro-wire micro-pattern useful in embodiments of the present invention.

In an embodiment, the first connection pads 24 are electrically connected to electrical busses 54 or micro-wire electrodes 52 (FIG. 1). Likewise, the second connection pads 34 are electrically connected to electrical busses 54 or micro-wire electrodes 52. In other embodiments, referring also to FIG. 3, a micro-pattern 56 of micro-wires 50 are electrically interconnected to form apparently transparent first or second connection pads 24, 34, micro-wire electrodes 52, or electrical busses 54. The micro-patterns 56 are the same or different for the first or second connection pads 24, 34, micro-wire electrodes 52, or electrical busses 54. In at least one embodiment, the micro-patterns 56 of the micro-wires 50 used for first or second connection pads 24, 34, or electrical busses 54 have a higher spatial density than the micro-patterns 56 of the micro-wires 50 used for the micro-wire electrodes 52. In other embodiments, the first or second connection pads 24, 34, or electrical busses 54 have wider micro-wires than the micro-wire electrodes 52 or have filled areas of conductive material. In an embodiment, the first or second connection pad 24, 34 is a single micro-wire and the first or second connection pad 24, 34 is a solid electrical conductor.

Referring to FIG. 4A, the first layer 20 is formed over the substrate 10 and a micro-channel 60 is imprinted in the first layer 20. Referring to FIG. 4B, the micro-channel 60 is filled with a micro-wire 50 in the first layer 20 on the substrate 10. Similarly, micro-wires 50 are formed in micro-channels 60 imprinted in the second layer 30 (not shown). Since the micro-wires 50 can fill the micro-channels 60, it can be difficult to distinguish them in the Figures. Micro-channels 60 are therefore indicated with and arrow and the micro-wires 50 are indicated with lead lines.

As shown in the embodiment of FIG. 1, the first connection pads 24 are arranged in a common row adjacent to the substrate edge 12. By adjacent is meant that no other connection pads are between the first connection pads 24 and the substrate edge 12. The second connection pads 34 are also in a common row adjacent to the first connection pads 24 on a side of the first connection pads 24 opposite the substrate edge 12 so that the first connection pads 24 are between the substrate edge 12 and the second connection pads 34.

Figure 5A:
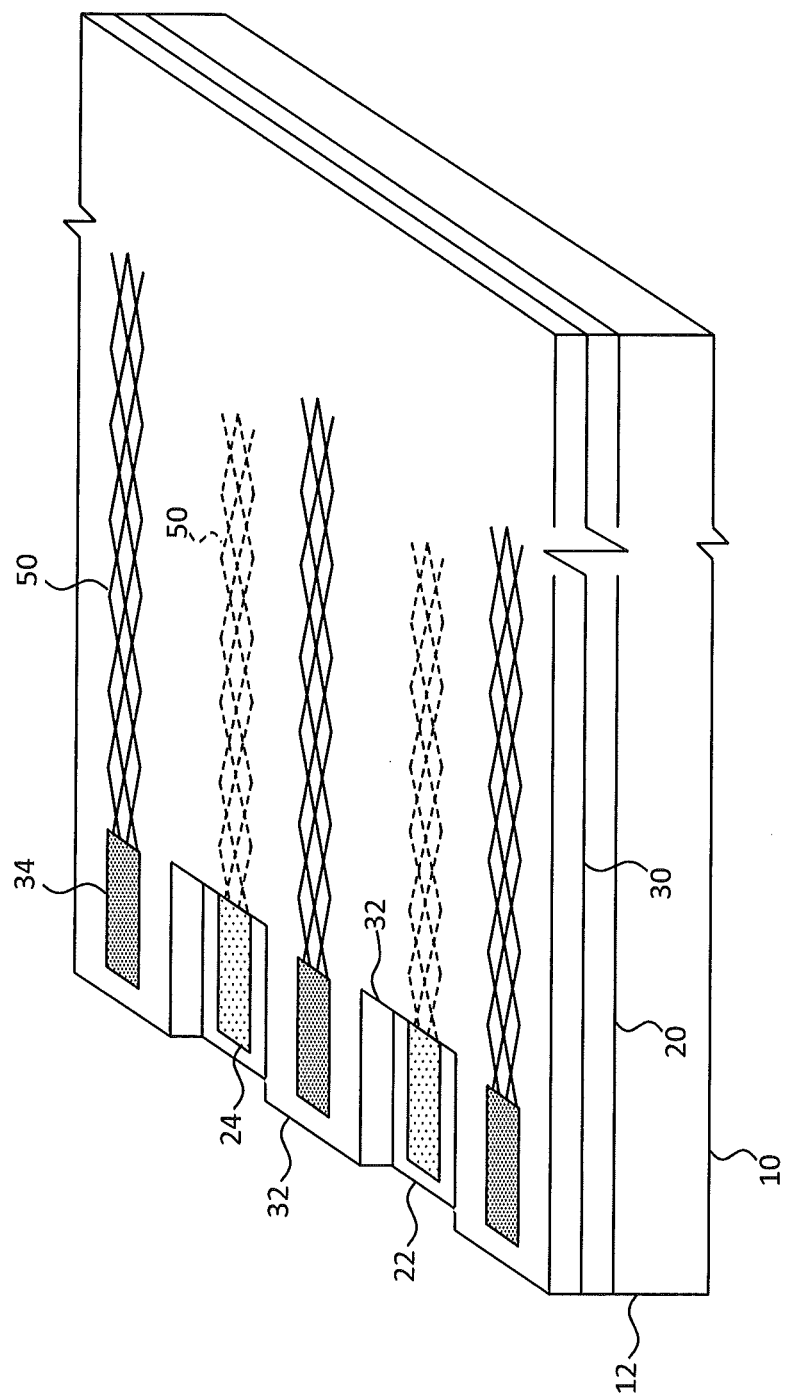
FIGS. 5A and 5B are perspectives of an embodiment of the present invention.
Figure 5B:
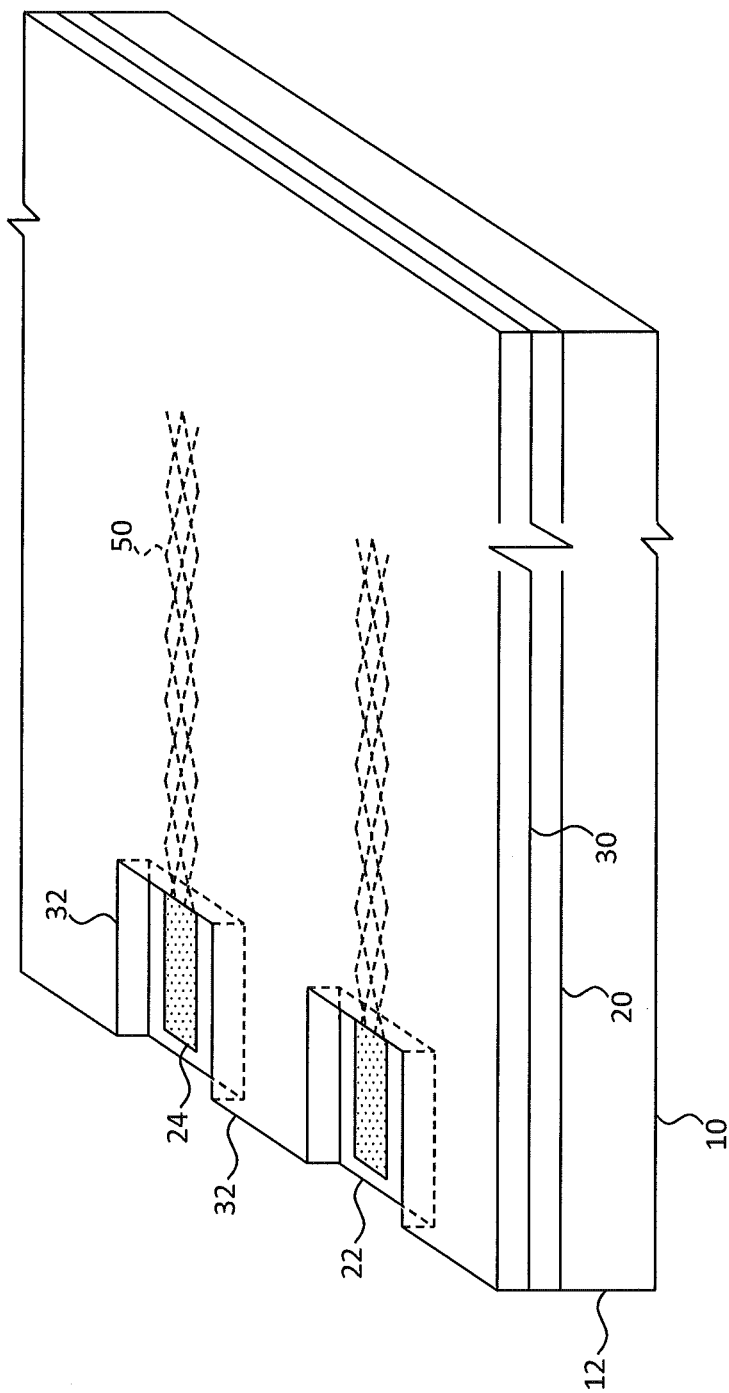
Figure 6:
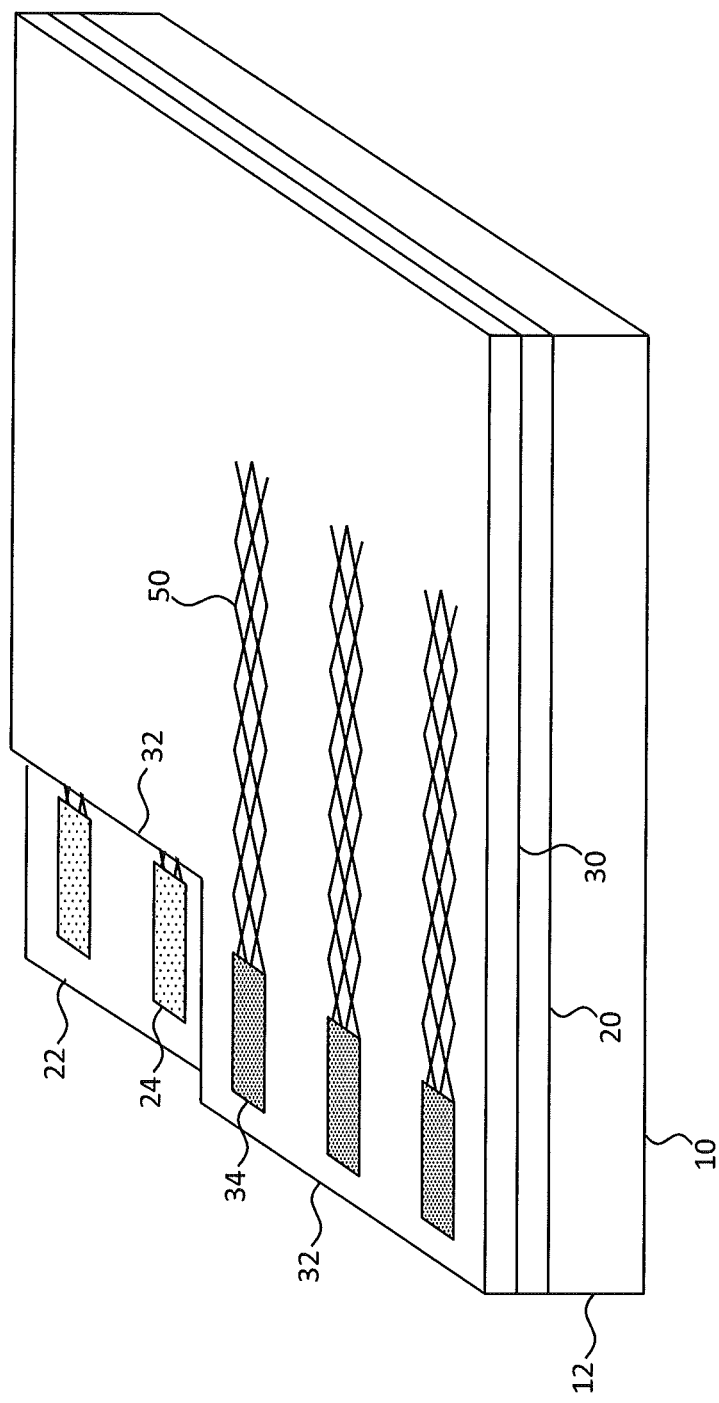
FIGS. 6-10 are perspectives of various embodiments of the present invention.

In an embodiment, as illustrated in FIG. 1, the first layer 20 has a straight edge or the second layer 30 has a straight edge. In an alternative embodiment of the multi-layer micro-wire structure 5, referring to FIGS. 5A and 5B, both the first and second connection pads 24, 34 in first and second layers 20, 30 are arranged adjacent to the substrate edge 12 of the substrate 10. First layer 20 has a straight first-layer edge 22 coincident with the substrate edge 12. As shown in FIG. 5A, the second layer 30 has a crenellated second-layer edge 32 and the first connection pads 24 alternate in a row with the second connection pads 34 along the substrate edge 12. Micro-wires 50 are electrically connected to the first and second connection pads 24, 34. FIG. 5B is a detail of the crenellated second layer edge 32 and illustrates the structure of the crenellated second-layer edge 32 and the micro-wire 50 connections to the first connection pads 24 with dashed hidden lines. Referring to FIG. 6, both the first and second connection pads 24, 34 connected to micro-wires 50 in the corresponding first and second layers 20, 30 are arranged adjacent to the substrate edge 12 of the substrate 10 in a row but do not alternate. Instead, the first connection pads 24 are at one end of the row and the second connection pads 34 are at the other end of the row. The first-layer edge 22 is coincident with the substrate edge 12 and the second-layer edge 32 is coincident with the substrate edge 12 for only a portion of the substrate edge 12.

In the embodiment of FIG. 1, the first connection pads 24 form a first row and the second connection pads 34 form a second, different row. The first connection pads 24 and the second connection pads 34 are aligned so that the corresponding first connection pads 24 and second connection pads 34 form a line orthogonal to the substrate edge 12. In an alternative embodiment illustrated in FIG. 7, the first connection pads 24 on the first layer 20 form a first row adjacent to the first-layer edge 22 and the second connection pads 34 on the second layer 30 form a second, different row adjacent to the second-layer edge 32 but the first connection pads 24 and the second connection pads 34 are offset so that the first connection pads 24 and the second connection pads 34 alternate along the substrate edge 12 of the substrate 10 and the corresponding first and second connection pads 24, 34 do not form a line orthogonal to the substrate edge 12.

Figure 7:
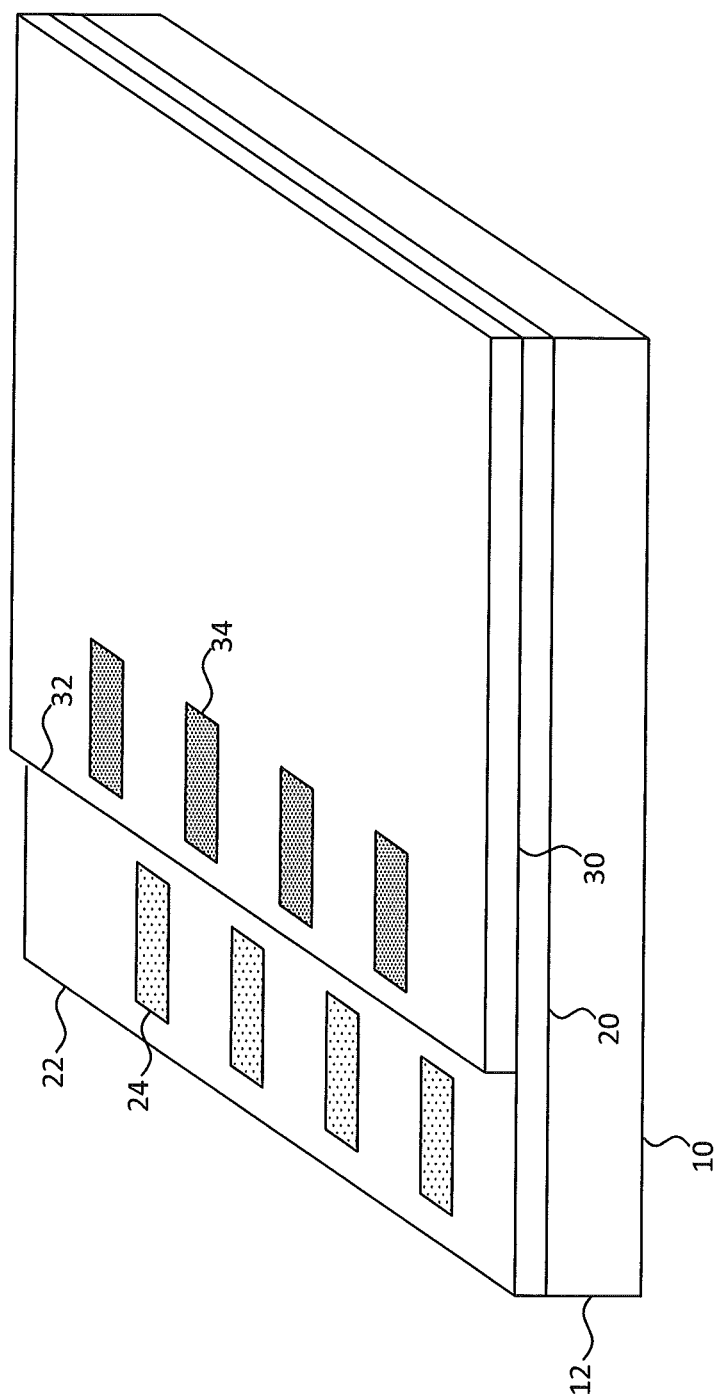
Figure 8:
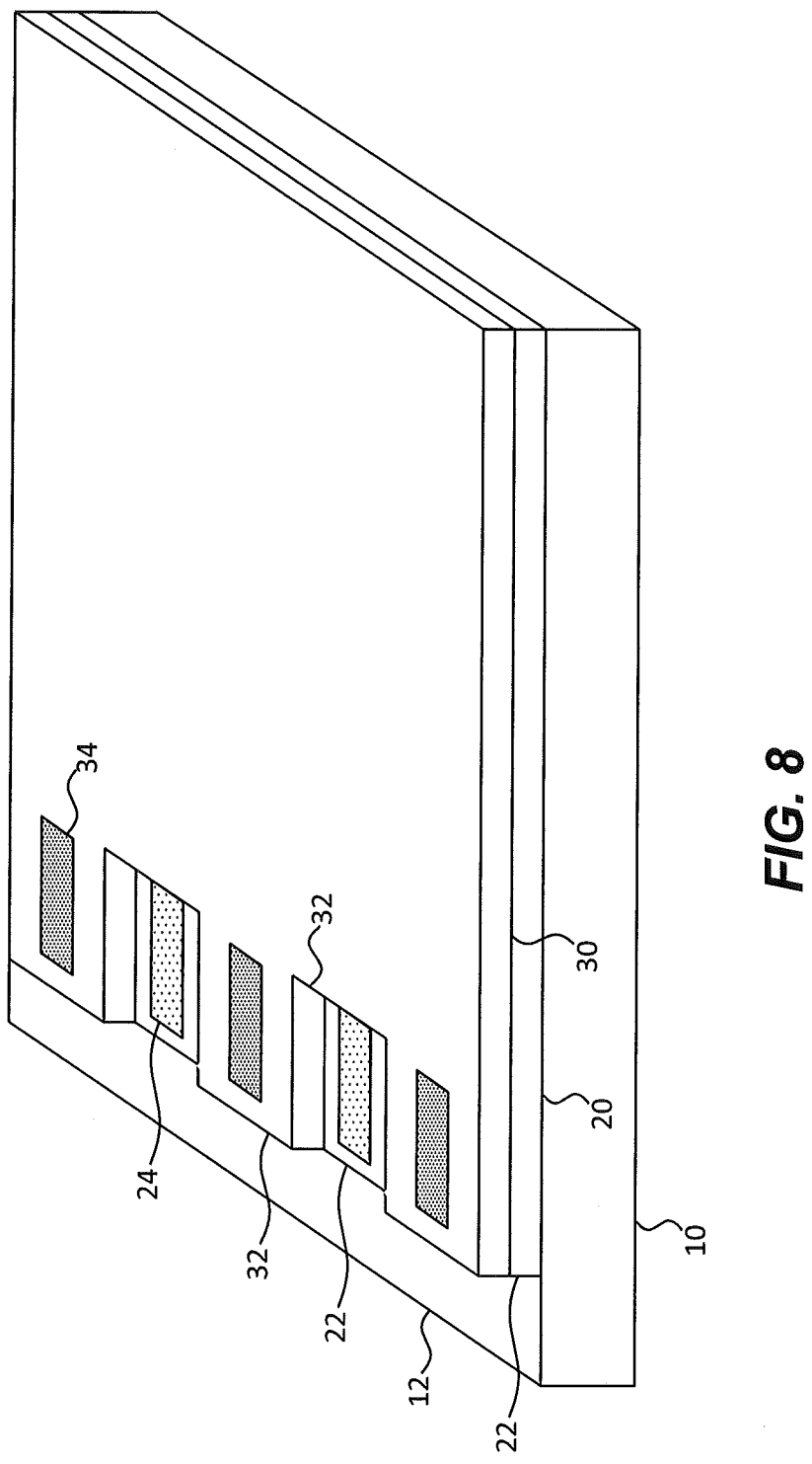
Figure 9:
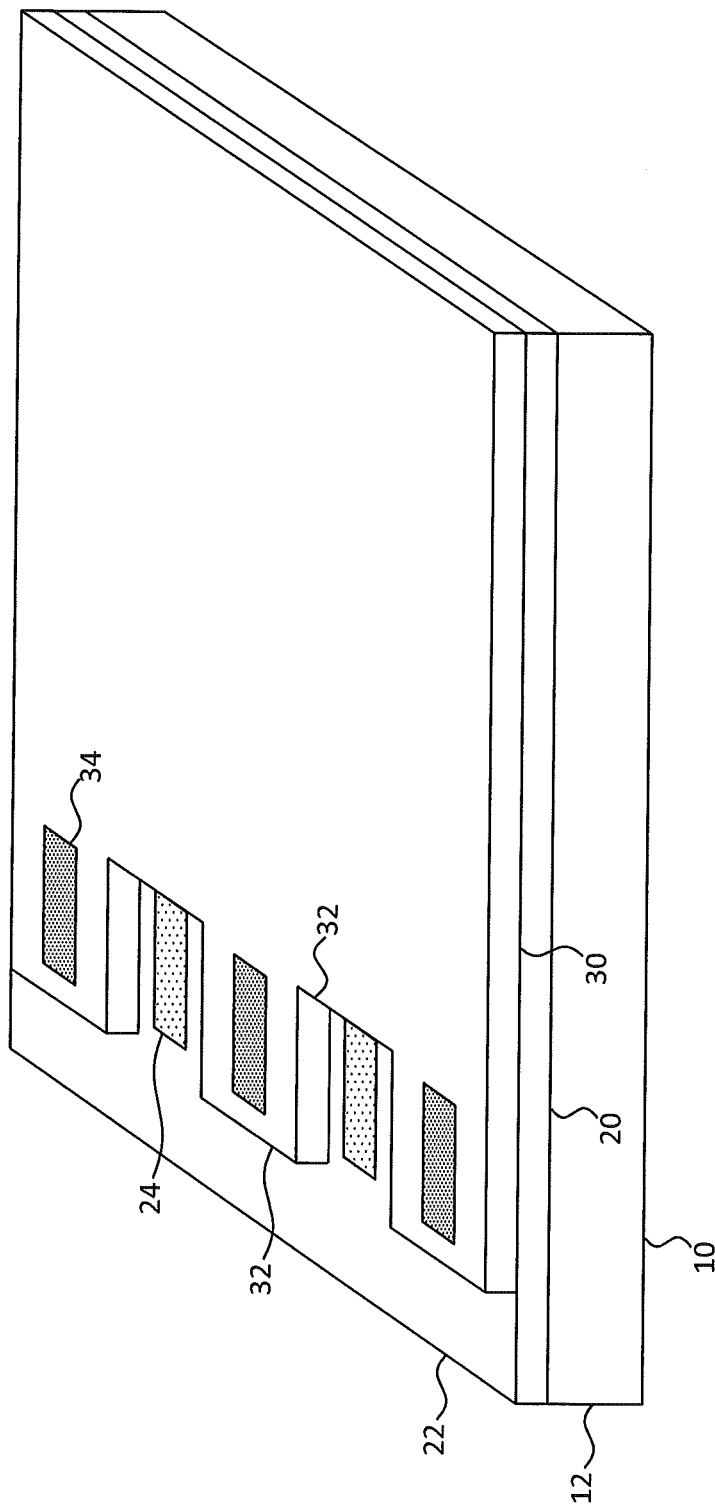

In the embodiments of FIGS. 5A, 6, and 7, the first-layer edge 22 is coincident with the substrate edge 12. In an alternative embodiment, illustrated in FIGS. 1 and 8, the first-layer edge 22 is not coincident with the substrate edge 12. Furthermore, in the embodiments of FIG. 5A and 6, a portion of the second-layer edge 32 is coincident with the first-layer edge 22. Alternatively, as shown in FIGS. 1 and 7, none of the second-layer edge 32 is coincident with the first-layer edge 22. Referring to FIG. 8, the first-layer edge 22 of the first layer 20 is not coincident with the substrate edge 12 of the substrate 10 and the second-layer edge 32 of the second layer 30 is only partially coincident with the first-layer edge 22. Referring to FIG. 9, the first-layer edge 22 of the first layer 20 is coincident with the substrate edge 12 of the substrate 10 and the second-layer edge 32 of the second layer 30 is only partially coincident with the first-layer edge 22. In FIGS. 8 and 9, the first and second connection pads 24, 34 alternate in a single row.

Figure 10:
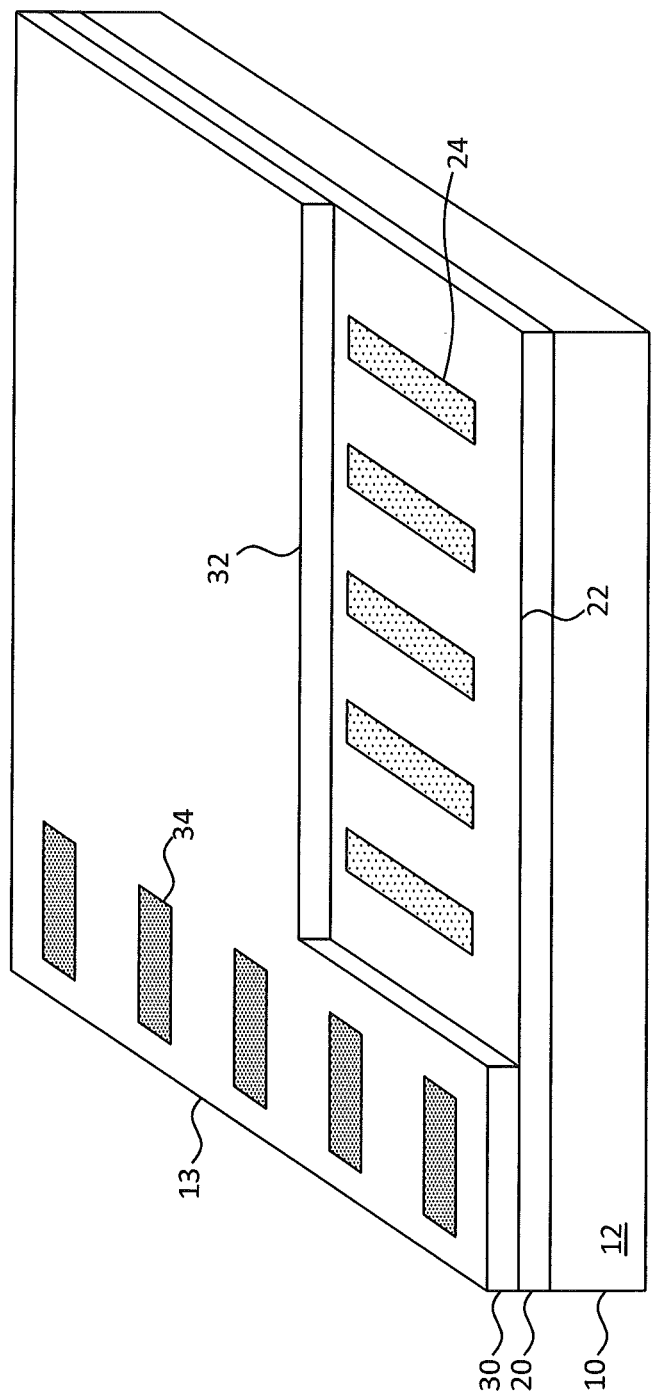

Referring to FIG. 10 in yet another embodiment of the present invention, the substrate 10 has a second substrate edge 13 extending in a different direction from the substrate edge 12. The first connection pads 24 are arranged in a row adjacent to the substrate edge 12 and the second connection pads 34 are arranged in a row adjacent to the second substrate edge 13. In such an embodiment, a portion of the second-layer edge 32 of second layer 30 extends parallel to the substrate edge 12 and another portion of the second-layer edge 32 of the second layer 30 extends parallel to the second substrate edge 13. The first layer 20 and the first-layer edge 22 are shown as coincident with the substrate edge 12 and the second substrate edge 13 but can be inset from either of the substrate edge 12 or the second substrate edge 13 (not shown).

Figure 11:
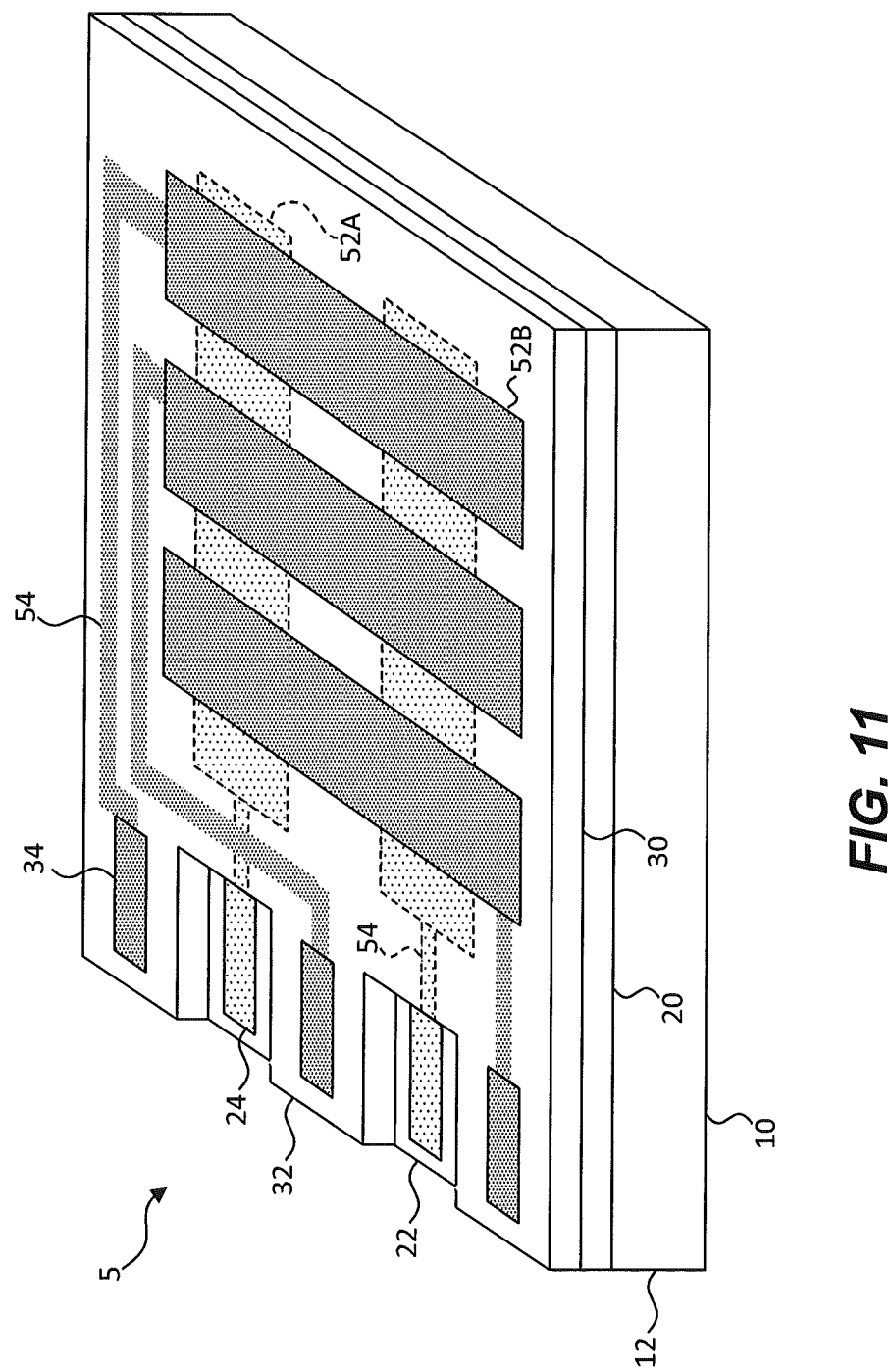
FIG. 11 is a perspective of an embodiment of the present invention having overlapping, orthogonal electrodes.

The first and second connection pads 24, 34 arrangements and the first and second layer 20, 30 structures are useful in connecting external control devices to an arrangement of micro-wire electrical busses 54, as shown in the multi-layer micro-wire structure 5 of FIG. 11. As shown in FIG. 11, the first and second layers 20, 30 are formed on the substrate 10. The first connection pads 24 are formed along the first-layer edge 22 coincident with the substrate edge 12. The second connection pads 34 are formed along the crenellated second-layer edge 32 forming a single row of connection pads. The micro-wire electrical busses 54 are connected to horizontal micro-wire electrodes 52A over the first layer 20 under the second layer 30 and the micro-wire electrical busses 54 are connected to vertical micro-wire electrodes 52B over the second layer 30. The horizontal micro-wire electrodes 52A extend in a direction orthogonal to the vertical micro-wire electrodes 52B. Where the horizontal micro-wire electrodes 52A and the vertical micro-wire electrodes 52B overlap or are closely adjacent, capacitors are formed that are useful in a capacitive touch screen. In other embodiments of the present invention, busses corresponding to the micro-wire electrical busses 54 and electrodes corresponding to the horizontal and vertical micro-wire electrodes 52A, 52B include transparent conductors and do not necessarily include micro-wires 50. The present invention includes such embodiments. In other embodiments, the micro-wires 50 and the first and second connection pads 24, 34 of the present invention are used to provide external electrical connections to various electrical circuits and arrangements of electrical conductors.

The various edge structures and the first and second connection pad 24, 34 arrangements illustrated are useful for enabling various electrical interconnections with electrical cables external to the substrate 10 and structures formed thereon. In embodiments having first and second connection pads 24, 34 arranged in a single row, a single row of connection points in, for example, a ribbon cable is affixed to the first and second connection pads 24, 34 (e.g. as in FIGS. 6, 8, and 9). In embodiments having the first and second connection pads 24, 34 arranged in separate rows, a double row of connection wires are affixed to the first and second connection pads 24, 34 (e.g. as in FIGS. 1 and 7). In embodiments having the first and second connection pads 24, 34 arranged along separate substrate edges, separate cables are electrically connected to the separate rows of first and second connection pads 24, 34 (e.g. as in FIG. 10).

Figure 12A:
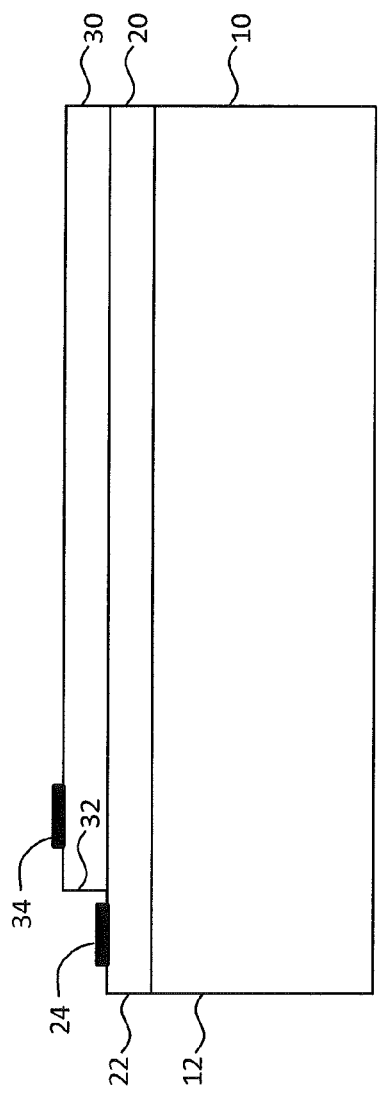
Figure 12B:
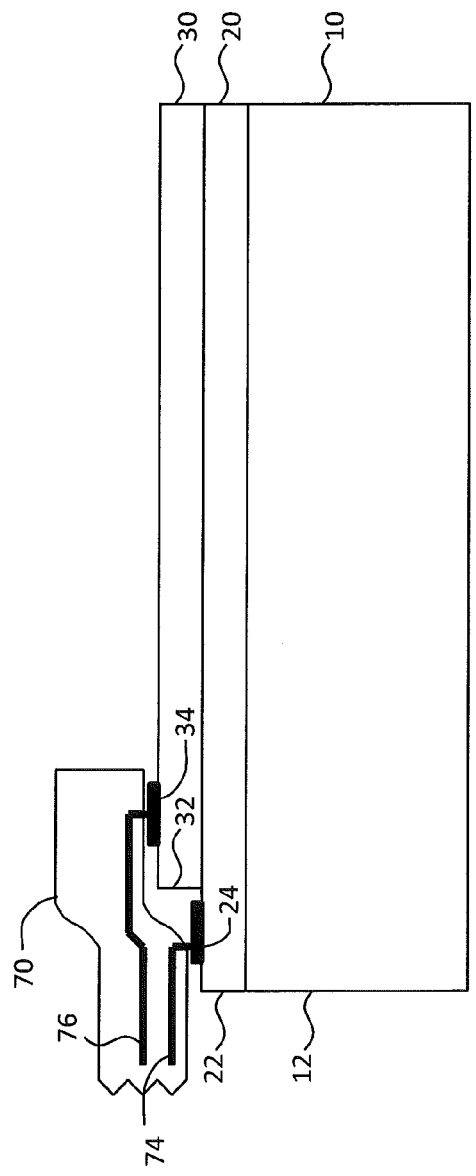

Referring to FIGS. 12A, 12B, 12C, and 12D, cross sections of embodiments of the present invention corresponding to FIG. 7 illustrate the substrate 10 with the first and second layers 20, 30 having the substrate edge 12, first-layer edge 22, and second-layer edge 32. The first connection pad 24 is formed on the first layer 20 and the second connection pad 34 is formed on the second layer 30. As shown in FIGS. 12B, 12C, and 12D, an electrical connector 70, for example, a ribbon cable, including multiple first and second wires 74, 76 is electrically connected to the first and second connection pads 24, 34 with an electrically conductive material, for example by using solder, adhesive conductors, or anisotropic conductors. At least one first wire 74 is electrically connected to one of the first connection pads 24 and at least one second wire 76 is electrically connected to one of the second connection pads 34.

In FIG. 12B, the electrical connector 70 is a compliant, compressible, or flexible electrical connector 70 that touches both the first connection pad 24 on first layer 20 and the second connection pad 34 on the second layer. Referring to FIG. 12C, the electrical connector 70 is not necessarily compliant, compressible, or flexible and can maintain a rigid, flat surface. In such an arrangement the thickness T1 of an electrically conductive material 72 between the first wire 74 of the electrical connector 70 and the first connection pad 24 on the first layer 20 is greater than the thickness T2 of an electrically conductive material 72 between the second wire 76 of the electrical connector 70 and the second connection pad 34 on the second layer 30. Thus, in an embodiment, the first wire 74 is electrically connected to the first connection pad 24 with an electrically conductive material having a first thickness T1, the second wire 76 is electrically connected to the second connection pad 34 with the electrically conductive material having a second thickness T2, and the first thickness T1 is greater than the second thickness T2. In FIG. 12D, the electrical connector 70 is not necessarily compliant, compressible, or flexible and can maintain a rigid, flat surface but the first and second layers 20, 30, or the substrate 10 are flexible, compressible, or compliant and are deformed to align the first connection pad 24 and the second connection pad 34 with the first and second wires 74, 76 of the electrical connector 70. The various arrangements of the electrical connector 70 illustrated in FIGS. 12B-12D can be used with the various first and second connection pads 24, 34 and the first and second layer 20, 30 structures illustrated in the Figures to connect external electrical components to electrical structures formed over the substrate 10.

Figure 13:
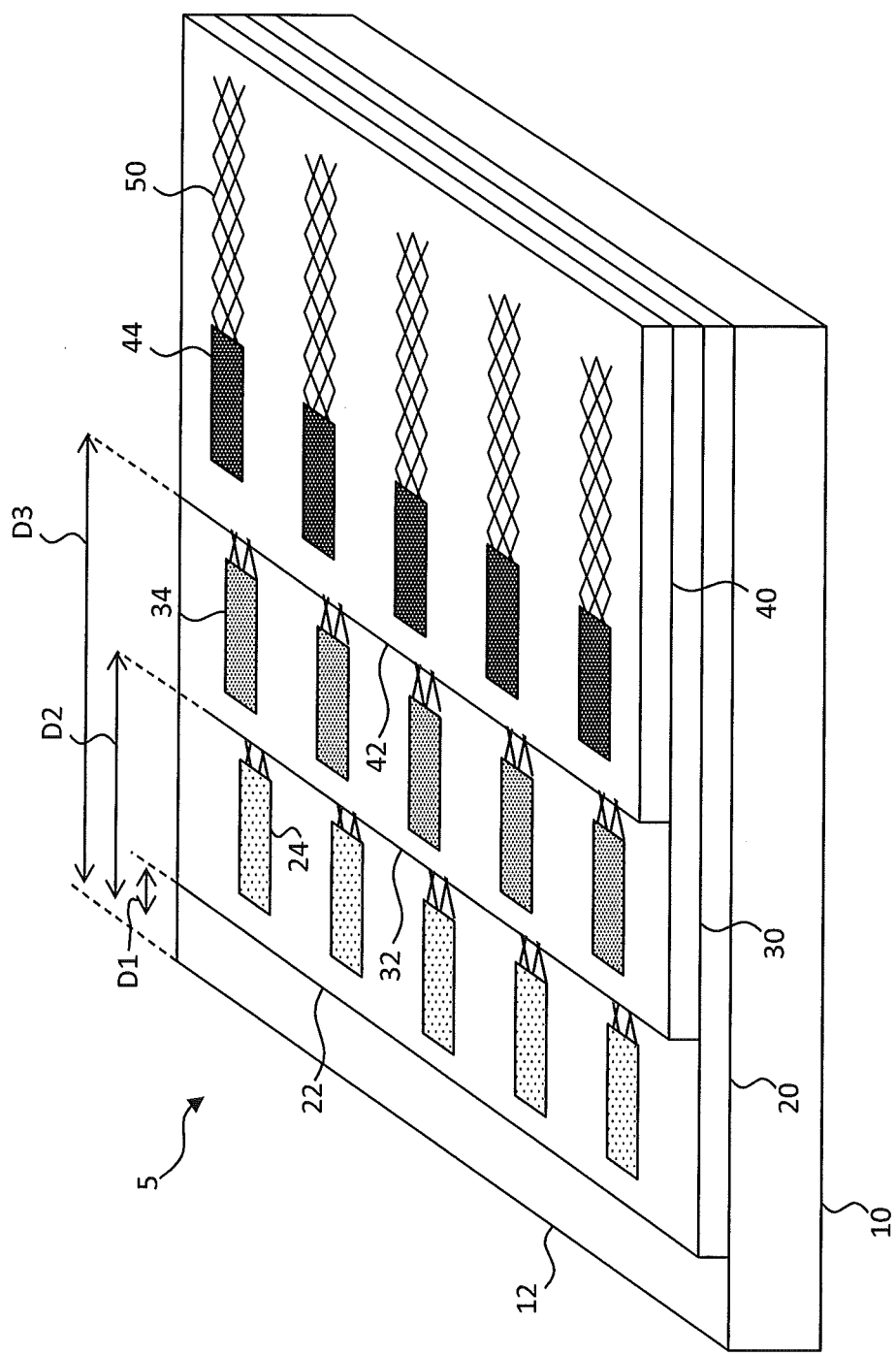
FIG. 13 is a perspective of another embodiment of the present invention.

In another embodiment of the present invention and as illustrated in FIG. 13, the multi-layer micro-wire structure 5 further includes a third layer 40 extending to a third-layer edge 42 formed over the second layer 30 and the first layer 20, the third layer 40 having imprinted micro-wires 50 forming a plurality of exposed third connection pads 44. The third-layer edge 42 is farther from the substrate edge 12 than the first-layer or second-layer edge 22, 32 for at least a portion of the first-layer or second-layer edge 22, 32 to expose the first and second connection pads 24, 34. As illustrated in FIG. 13, the third-layer edge 42 is a distance D3 from the substrate edge 12 that is greater than the distance D2 that the second-layer edge 32 is from the substrate edge 12 and the distance D1 that the first-layer edge 22 is from the substrate edge 12.

As shown in FIG. 13, the third layer edge 42 is farther from the substrate edge 12 than the first-layer and second-layer edges 22, 32. In FIG. 13, all of the third layer edge 42 is farther from the substrate edge 12 than all of the first- and second-layer edges 22, 32. In another embodiment (not shown), only a portion of the third layer edge 42 is farther from the substrate edge 12 than at least a portion of the first- or second-layer edges 22, 32, for example with a crenellated edge.

Figure 14:
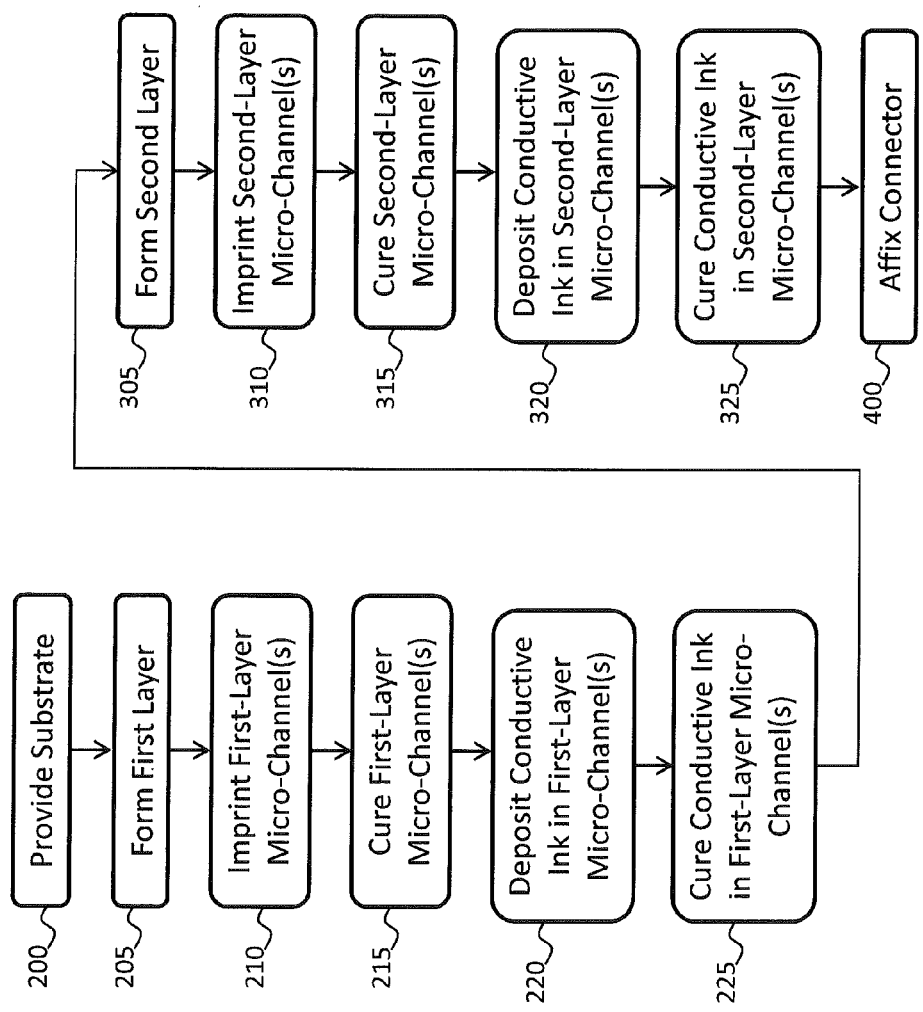
FIG. 14 is a flow diagram illustrating a method according to an embodiment of the present invention.

According to another embodiment of the present invention illustrated in FIG. 14, a method of making a multi-layer micro-wire structure 5 includes providing a substrate 10 having a substrate edge 12 in step 200. A first layer 20 is formed over the substrate 10 extending to a first layer edge 22 in step 205. One or more first micro-channels 62 are imprinted in the first layer 20 in step 210. In step 215, the one or more first micro-channels 62 in the first layer 20 are cured. In step 220, conductive ink is deposited in the first micro-channels 62 and cured (step 225) to form micro-wires 50 in at least one imprinted first micro-channel 62. The first micro-wire 50 forms at least a portion of an exposed first connection pad 24 in the first layer 20.

A second layer 30 is formed over the first layer 20 extending to a second layer edge 32 in step 305. In step 310, one or more second micro-channels 64 are imprinted in the second layer 30 and cured in step 315. In step 320, conductive ink is deposited in the second micro-channel 64 and cured (step 325) to form micro-wires 50 in at least one imprinted second micro-channel 62. The second micro-wire 50 forms at least a portion of an exposed second connection pad 34 in the second layer 30. The second-layer edge 32 is farther from the substrate edge 12 than the first-layer edge 22 for at least a portion of the second-layer edge 22 so that the first connection pads 24 are exposed through the second layer 30.

In step 400, an electrical connector 70 is affixed and electrically connected to the first and second connection pads 24, 34.

According to various embodiments of the present invention, the first and second connection pads 24, 34 are formed in a common row or along the substrate edge 12. The first or second layers 20, 30 are formed with straight edges; alternatively the second layer is formed with a crenellated edge. In an embodiment, the first connection pads 24 are formed in a row adjacent to the substrate edge 12 and the second connection pads 34 are formed in a row adjacent to the first connection pads 24 so that the first connection pads 24 are between the substrate edge 12 and the second connection pads 34. In another embodiment, the first connection pads 24 are formed adjacent to each other and the second connection pads 34 are formed adjacent to each other or the first and second connection pads 24, 34 are formed alternately in a row.

In various embodiments, the second connection pads 34 are formed in alignment with the first connection pads 24 or are formed offset from the first connection pads 24.

In other embodiments, the first-layer edge 22 is formed coincident with the substrate edge 12 or is formed not in coincidence with the substrate edge 12. In an embodiment, a portion of the second-layer edge 22 is formed coincident with the substrate edge 12. Alternatively, the substrate 10 has a second substrate edge 13 extending in a different direction from the substrate edge 12, and the first connection pads 24 are formed in a row adjacent to the substrate edge 12 and the second connection pads 34 are formed in a row adjacent to the second substrate edge 13.

In an embodiment of the present invention, an electrical connector 70 including multiple first and second wires is provided. At least one first wire is electrically connected to one of the first connection pads 24 and at least one second wire is electrically connected to one of the second connection pads 34. The electrical connector 70 can be a ribbon cable or a flex connector. The electrical connector 70 can be flexible, compressible, or compliant. Alternatively or in addition, the substrate 10, the first layer 20, or the second layer 30 is flexible, compliant, or compressible.

In a further embodiment, a first wire 74 is electrically connected to a first connection pad 24 with an electrically conductive material having a first thickness and a second wire 76 is electrically connected to a second connection pad 34 with the electrically conductive material having a second thickness. The first thickness is greater than the second thickness.

In an embodiment, a third layer 40 extending to a third layer edge 42 is formed over the second layer 30, micro-channels 60 are imprinted in the third layer 40 and micro-wires 50 formed in the micro-channels 60 to form a plurality of exposed third connection pads 44 in the third layer 40. The third-layer edge 42 is farther from the substrate edge 12 than the first- or second-layer edge 22, 32 for at least a portion of the first- or second-layer edge 22, 32 to expose the first and second connection pads 24, 34. In an embodiment, the third-layer edge 42 is farther from the substrate edge 12 than the first-layer and second-layer edges 22, 32.

Figure 15:
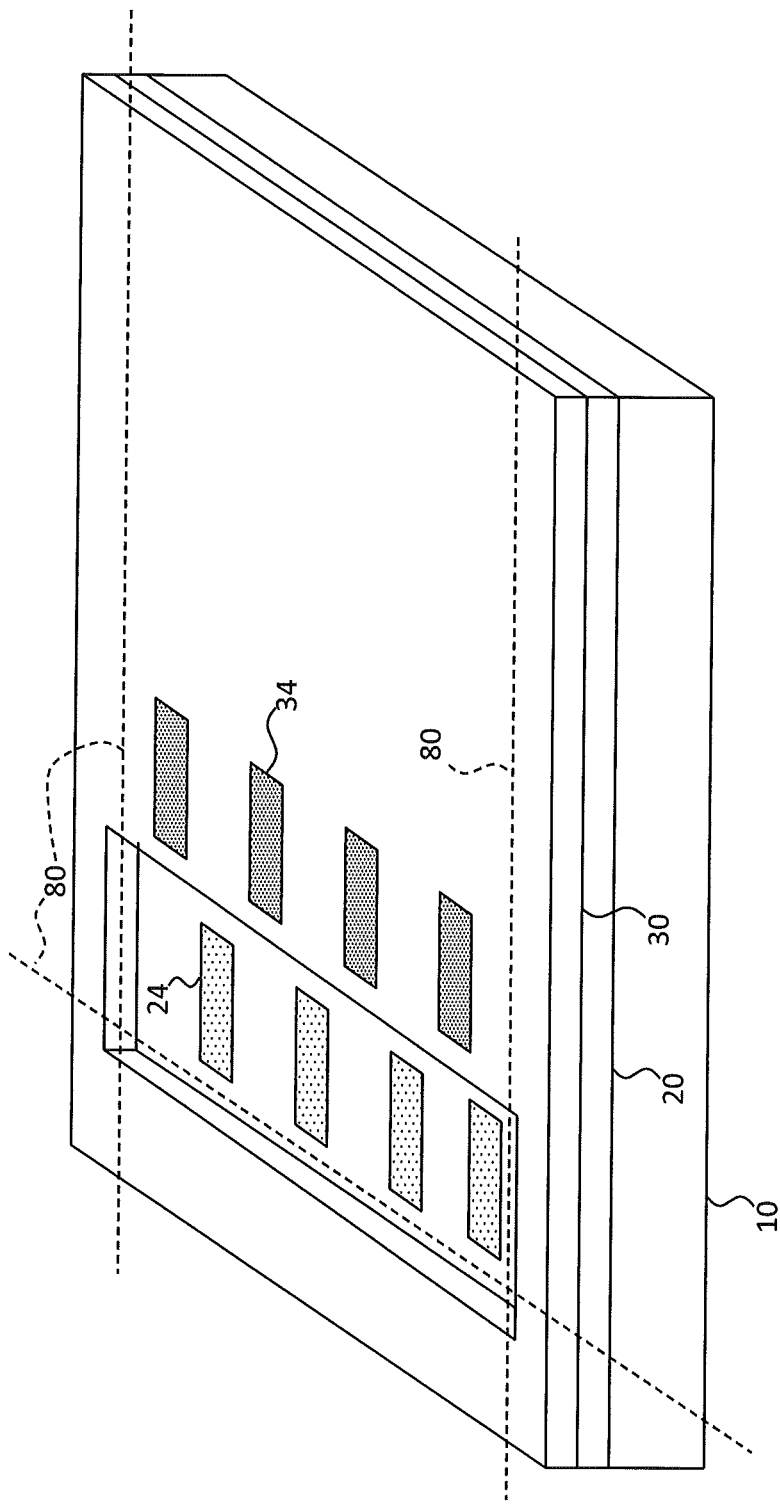
FIG. 15 is a perspective of an imprinted structure useful in forming an embodiment of the present invention.
Figure 16:
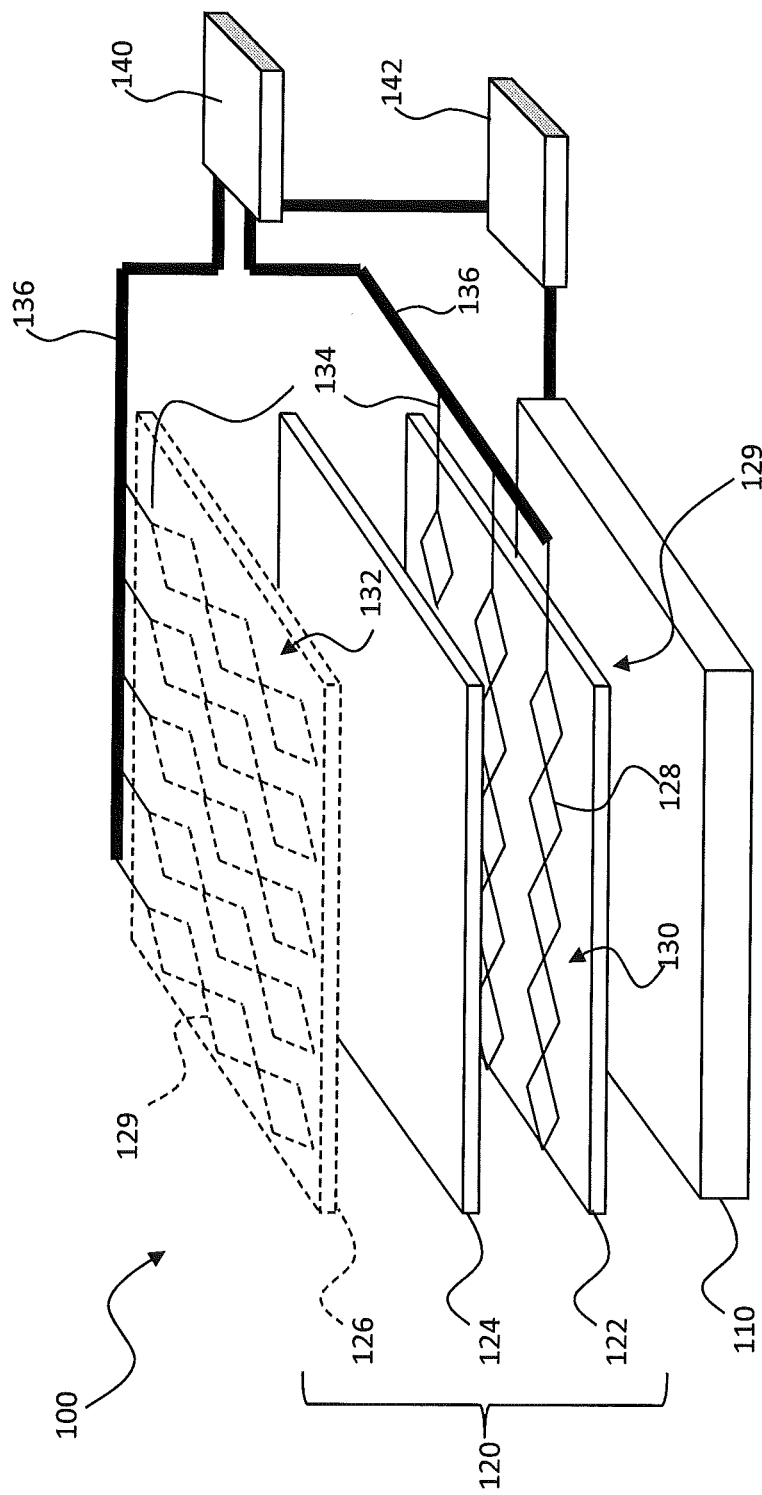
FIG. 16 is a perspective of a touch screen and a display according to the prior art.

In one embodiment of the present invention, the second-layer edge 32 of the second layer 30 is defined with an imprinting stamp that is used in a common step to imprint micro-channels 60. In a further embodiment referring to FIG. 15, the second layer 30 is imprinted in a first step to expose the first connection pads 24 in first layer 20 on substrate 10 through the second layer 30 while leaving material forming the second layer 30 with the second connection pads 34 at the substrate edge 12. In a second step, the edges of the substrate 10 and second layer 30 material is removed, for example by cutting or abrading the edges of the substrate 10 along cut lines 80 to form a new substrate edge 12, as illustrated in FIG. 7. Material is removed from at least one, two, or three edges depending on the final structure. For example, material is removed from three sides to form the structure of FIG. 7 and material is removed only from one side to form the structure of FIG. 5A or FIG. 9.

The first or second layers 20, 30 useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated. When a molding device, such as an imprinting stamp having an inverse micro-channel structure is applied to liquid curable material coated on the substrate 10 and the cross-linking agents in the curable material are activated, the liquid curable material in first or second layers 20, 30 is hardened into a cured layer with imprinted micro-channels 60. The liquid curable materials can include a surfactant to assist in controlling coating on the substrate 10. Materials, tools, and methods are known for imprinting coated liquid curable materials to form cured layers having micro-channels 60.

Curable inks useful in the present invention are known and can include conductive inks having metal particles, for example electrically conductive nano-particles. The electrically conductive nano-particles can be metallic or have an electrically conductive shell. The electrically conductive nano-particles can be silver, can be a silver alloy, or can include silver or other metals, such as tin, tantalum, titanium, gold, copper, or aluminum, or alloys thereof. The metal particles can be sintered to form a metallic electrical conductor. Cured inks can include light-absorbing materials such as carbon black, a dye, or a pigment.

Curable inks provided in a liquid form are deposited or located in micro-channels 60. Once deposited, the conductive inks are cured, for example by heating or exposure to radiation such as infra-red, visible light, or ultra-violet radiation. The curing process drives out the liquid carrier and sinters the metal particles to form a metallic electrical conductor. The curable ink hardens to form the cured ink that makes up micro-wires 50. For example, a curable conductive ink with conductive nano-particles is located by coating first or second layers 20, 30 to fill micro-channels 60 and heated to agglomerate or sinter the nano-particles, thereby forming electrically conductive micro-wires 50. Materials, tools, and methods are known for coating liquid curable inks to form micro-wires 50 in micro-channels 60.

In an embodiment, a curable ink can include conductive nano-particles in a liquid carrier (for example an aqueous solution including surfactants that reduce flocculation of metal particles, humectants, thickeners, adhesives or other active chemicals). The liquid carrier is located in micro-channels 60 and heated or dried to remove liquid carrier or treated with hydrochloric acid, leaving a porous assemblage of conductive particles that are agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in micro-wire 50 formation process.

According to various embodiments of the present invention, the substrate 10 is any material having a surface on which a cured first layer 20 is formed. Substrate 10 can be a rigid or a flexible substrate made of, for example, a glass, metal, plastic, or polymer material, can be transparent, and can have opposing substantially parallel and extensive surfaces. Substrates 10 can include a dielectric material useful for capacitive touch screens and can have a wide variety of thicknesses, for example 10 microns, 50 microns, 100 microns, 1 mm, or more. In various embodiments of the present invention, substrates 10 are provided as a separate structure or are coated on another underlying substrate, for example by coating a polymer substrate layer on an underlying glass substrate.

Substrate 10 can be an element of other devices, for example the cover or substrate of a display or a substrate, cover, or dielectric layer of a touch screen. In an embodiment, a substrate 10 of the present invention is large enough for a user to directly interact therewith, for example using an implement such as a stylus or using a finger or hand. Methods are known in the art for providing suitable surfaces on which to coat a single curable layer. In a useful embodiment, substrate 10 is substantially transparent, for example having a transparency of greater than 90%, 80% 70% or 50% in the visible range of electromagnetic radiation.

A micro-channel 60 is a groove, trench, or channel formed on or in substrate 10 and can have a cross-sectional width less than 20 microns, for example 10 microns, 5 microns, 4 microns, 3 microns, 2 microns, 1 micron, or 0.5 microns, or less. Micro-channels 60 can have a rectangular cross section, as shown. Other cross-sectional shapes, for example trapezoids, are known and are included in the present invention. The width or depth of a layer is measured in cross section.

In various embodiments of the present invention, micro-channel 60 or micro-wire 50 has a width less than or equal to 10 microns, 5 microns, 4 microns, 3 microns, 2 microns, or 1 micron. In an example and non-limiting embodiment of the present invention, each micro-wire 50 is from 10 to 15 microns wide, from 5 to 10 microns wide, or from 5 microns to one micron wide. In some embodiments, micro-wire 50 can fill micro-channel 60; in other embodiments micro-wire 50 does not fill micro-channel 60. In an embodiment, micro-wire 50 is solid; in another embodiment micro-wire 50 is porous.

Electrically conductive micro-wires 50 and methods of the present invention are useful for making electrical conductors and busses for transparent micro-wire electrodes and electrical conductors in general, for example as used in electrical busses 54. A variety of micro-patterns 56 can be used and the present invention is not limited to any one pattern. Micro-wires 50 can be spaced apart, form separate electrical conductors, or intersect to form a mesh electrical conductor on or in substrate 10 or first or second layers 20, 30. Micro-channels 60 can be identical or have different sizes, aspect ratios, or shapes. Similarly, micro-wires 50 can be identical or have different sizes, aspect ratios, or shapes. Micro-wires 50 can be straight or curved.

Micro-wires 50 can be metal, for example silver, gold, aluminum, nickel, tungsten, titanium, tin, or copper or various metal alloys including, for example silver, gold, aluminum, nickel, tungsten, titanium, tin, or copper. Micro-wires 50 can include a thin metal layer composed of highly conductive metals such as gold, silver, copper, or aluminum. Other conductive metals or materials can be used. Alternatively, micro-wires 50 can include cured or sintered metal particles such as nickel, tungsten, silver, gold, titanium, or tin or alloys such as nickel, tungsten, silver, gold, titanium, or tin. Conductive inks can be used to form micro-wires 50 with pattern-wise deposition or pattern-wise formation followed by curing steps. Other materials or methods for forming micro-wires 50, such as curable ink powders including metallic nano-particles, can be employed and are included in the present invention.

Electrically conductive micro-wires 50 of the present invention can be operated by electrically connecting micro-wires 50 through first or second connection pads 24, 34 and electrical connectors 70 to electrical circuits that provide electrical current to micro-wires 50 and can control the electrical behavior of micro-wires 50. Electrically conductive micro-wires 50 of the present invention are useful, for example in touch screens such as projected-capacitive touch screens that use transparent micro-wire electrodes and in displays. Electrically conductive micro-wires 50 can be located in areas other than display areas, for example in the perimeter of the display area of a touch screen, where the display area is the area through which a user views a display.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D1 distance
D2 distance
D3 distance
T1 thickness
T2 thickness
x x dimension
y y dimension
5 multi-layer micro-wire structure
10 substrate
12 substrate edge
13 second substrate edge
20 first layer
22 first-layer edge
24 first connection pad
30 second layer
32 second-layer edge
34 second connection pad
40 third layer
42 third-layer edge
44 third connection pad
50 micro-wire
52 micro-wire electrode
52A horizontal micro-wire electrode
52B vertical micro-wire electrode
54 electrical buss
56 micro-pattern
60 micro-channel
62 first micro-channel
64 second micro-channel
70 electrical connector
72 electrically conductive material
Parts List (Con't)
74 first wire
76 second wire
80 cut lines
100 display system and touch screen
110 display
120 touch screen 122 first transparent substrate
124 transparent dielectric layer
126 second transparent substrate
128 first pad area
129 second pad area
130 first transparent electrode
132 second transparent electrode
134 wires
136 electrical buss connections
140 touch-screen controller
142 display controller
150 micro-wire
156 micro-pattern
200 provide substrate step
205 form first layer step
210 imprint first-layer micro-channels step
215 cure first-layer micro-channels step
220 deposit conductive ink in first-layer micro-channels step
225 cure conductive ink in first-layer micro-channels step
305 form second layer step
310 imprint second-layer micro-channels step
315 cure second-layer micro-channels step
320 deposit conductive ink in second-layer micro-channels step
325 cure conductive ink in second-layer micro-channels step
400 affix connector step

The invention claimed is:

1. A multi-layer micro-wire structure, comprising:
a substrate having a substrate edge;
a first layer formed over the substrate extending to a first layer edge;
one or more first micro-channels imprinted in the first layer, at least one imprinted first micro-channel having a first micro-wire forming at least a portion of an exposed first connection pad in the first layer;
a second layer formed over the first layer extending to a second layer edge;
one or more second micro-channels imprinted in the second layer, at least one imprinted second micro-channel having a second micro-wire that is electrically separate from the first micro-wire forming at least a portion of an exposed second connection pad in the second layer, the second connection pad spatially separate from the first connection pad; and
wherein the first connection pad is exposed in a first location over the substrate, the second connection pad is exposed in a second location different from the first location over the substrate, and the second-layer edge is farther from the substrate edge than the first-layer edge for at least a portion of the second-layer edge so that the first connection pads are exposed through the second layer and the first and second connection pads can be separately electrically connected to separate wires in one or more electrical connectors.

2. The multi-layer micro-wire structure of claim 1, wherein the first and second connection pads are arranged in a common row.

3. The multi-layer micro-wire structure of claim 1, wherein the first and second connection pads are arranged along the substrate edge.

4. The multi-layer micro-wire structure of claim 1, wherein the second layer has a crenellated edge.

5. The multi-layer micro-wire structure of claim 1, wherein the second layer has a straight edge.

6. The multi-layer micro-wire structure of claim 1, wherein the first connection pads are arranged in a row adjacent to the substrate edge, the second connection pads are arranged in a row adjacent to the first connection pads, and the first connection pads are between the substrate edge and the second connection pads.

7. The multi-layer micro-wire structure of claim 1, wherein the substrate has a second substrate edge extending in a different direction from the substrate edge, the first connection pads are arranged in a row adjacent to the substrate edge, and the second connection pads are arranged in a row adjacent to the second substrate edge.

8. The multi-layer micro-wire structure of claim 1, wherein the first connection pads are adjacent to each other and the second connection pads are adjacent to each other.

9. The multi-layer micro-wire structure of claim 1, wherein the first and second connection pads alternate in a row.

10. The multi-layer micro-wire structure of claim 1, wherein the first connection pads are aligned with the second connection pads.

11. The multi-layer micro-wire structure of claim 1, wherein the first connection pads are offset from the second connection pads.

12. The multi-layer micro-wire structure of claim 1, wherein the first layer edge is coincident with the substrate edge.

13. The multi-layer micro-wire structure of claim 1, wherein a portion of the second layer edge is coincident with the substrate edge.

14. The multi-layer micro-wire structure of claim 1, further including a connector including multiple first and second wires, at least one first wire electrically connected to one of the first connection pads and at least one second wire electrically connected to one of the second connection pads.

15. The multi-layer micro-wire structure of claim 1, wherein the connector is a ribbon cable.

16. The multi-layer micro-wire structure of claim 1, wherein the connector is flexible, compressible, or compliant.

17. The multi-layer micro-wire structure of claim 1, wherein the substrate, the first layer, or the second layer is flexible, compliant, or compressible.

18. The multi-layer micro-wire structure of claim 1, wherein a first wire is electrically connected to a first connection pad with an electrically conductive material having a first thickness, a second wire is electrically connected to a second connection pad with the electrically conductive material having a second thickness, and the first thickness is greater than the second thickness.

19. A multi-layer micro-wire structure, comprising:
a substrate having a substrate edge;
a first layer formed over the substrate extending to a first layer edge;
one or more first micro-channels imprinted in the first layer, at least one imprinted first micro-channel having a micro-wire forming at least a portion of an exposed first connection pad in the first layer;
a second layer formed over the first layer extending to a second layer edge;
one or more second micro-channels imprinted in the second layer, at least one imprinted second micro-channel having a micro-wire forming at least a portion of an exposed second connection pad in the second layer;
wherein the second-layer edge is farther from the substrate edge than the first-layer edge for at least a portion of the second-layer edge so that the first connection pads are exposed through the second layer; and
further including a third layer extending to a third-layer edge formed over the second layer, the third layer having imprinted micro-channels including micro-wires forming a plurality of exposed third connection pads;

wherein the third-layer edge is farther from the substrate edge than the first- or second-layer edge for at least a portion of the first- or second-layer edge to expose the first and second connection pads.

20. The multi-layer micro-wire structure of claim 19, wherein the third-layer edge is farther from the substrate edge than the first- and second-layer edge.

* * * * *